United States Patent
Loo et al.

(10) Patent No.: US 8,032,349 B2
(45) Date of Patent: Oct. 4, 2011

(54) EFFICIENT METHODOLOGY FOR THE ACCURATE GENERATION OF CUSTOMIZED COMPACT MODEL PARAMETERS FROM ELECTRICAL TEST DATA

(75) Inventors: Sim Y. Loo, Rochester, MN (US); Steven G. Lovejoy, Hopewell Junction, NY (US); Myung-Hee Na, Lagrangeville, NY (US); Edward J. Nowak, Essex Junction, VT (US); Scott K. Springer, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 824 days.

(21) Appl. No.: 11/626,915

(22) Filed: Jan. 25, 2007

(65) Prior Publication Data

US 2008/0183442 A1    Jul. 31, 2008

(51) Int. Cl.
G06F 17/50       (2006.01)
G06F 7/60        (2006.01)

(52) U.S. Cl. ................................. 703/14; 703/2; 716/54
(58) Field of Classification Search ................ 703/14, 703/2; 716/54

See application file for complete search history.

(56) References Cited

U.S. PATENT DOCUMENTS

| | | | |
|---|---|---|---|
| 5,719,796 A * | 2/1998 | Chen | 703/13 |
| 5,966,312 A * | 10/1999 | Chen | 703/6 |
| 6,185,472 B1 * | 2/2001 | Onga et al. | 700/121 |
| 6,282,693 B1 * | 8/2001 | Naylor et al. | 716/114 |
| 6,314,390 B1 | 11/2001 | Bittner et al. | |
| 6,560,568 B1 * | 5/2003 | Singhal et al. | 703/2 |
| 6,795,800 B1 * | 9/2004 | Lee | 703/2 |
| 6,934,671 B2 | 8/2005 | Bertsch et al. | |
| 7,263,477 B2 * | 8/2007 | Chen et al. | 703/13 |
| 2002/0133785 A1 * | 9/2002 | Kondo | 716/1 |
| 2003/0220779 A1 * | 11/2003 | Chen et al. | 703/14 |
| 2005/0086033 A1 | 4/2005 | Chen et al. | |

* cited by examiner

*Primary Examiner* — Paul Rodriguez
*Assistant Examiner* — Juan C Ochoa
(74) *Attorney, Agent, or Firm* — Gibb I.P. Law Firm, LLC; Richard M. Kotulak, Esq.

(57) ABSTRACT

Disclosed herein are embodiments of an automated, fast and efficient method of generating a customized compact model that represents a semiconductor device at the chip, wafer or multi-wafer level in a specific manufacturing environment. Specifically, measurement data is collected from a specific manufacturing environment and sorted by channel lengths. Then, an optimizer is used to generate customized modeling parameters based on the measurement data. The optimization processes is a multi-step process. First, a first set of modeling parameters is generated based on measurement data associated with a long channel length. Second, a second set of modeling parameters is generated based on the first set and on measurement data associated with a short channel length. Finally, the customized modeling parameters are generated based on both the first set and the second set. The customized modeling parameters are used to generate a customized compact device model representative of the specific manufacturing environment.

15 Claims, 2 Drawing Sheets

EFFICIENT METHODOLOGY FOR THE ACCURATE GENERATION OF CUSTOMIZED COMPACT MODEL PARAMETERS FROM ELECTRICAL TEST DATA

BACKGROUND

1. Field of the Invention

The embodiments of the invention generally relate to compact models for semiconductor devices and, more particularly, to a method for generating a customized compact model that represents a semiconductor device at the chip, wafer or multi-wafer level in a specific manufacturing environment.

2. Description of the Related Art

A compact model generally represents the electrical and physical behavior of an electronic device in its various operation modes. These compact models are incorporated into simulators to represent the various active and passive components of a semiconductor technology (e.g., a circuit). Compact models provide a powerful tool for predicting accurate circuit behaviors. Therefore, accurate compact models are essential. However, variations in the manufacturing line and deviations from the standard semiconductor process steps sometimes result in differences between the electrical parameters represented in the compact models and those actually present during the manufacturing process. Therefore, when circuit designers conduct model-to-hardware correlation studies to understand how simulations and hardware measurements compare, "model overrides" (i.e., adjustments) are made to the compact model parameters in order to match actual parameter measurements taken from the hardware under study. These overrides allow designers to analyze and assess the impact of manufacturing variations and to predict potential circuit problems.

Model to hardware correlation studies typically employ simulations to solve for a limited set of parameters, for example, as illustrated in U.S. Pat. No. 6,934,671 issued to Bertsch et al. on Aug. 23, 2005 and incorporated herein by reference. These studies operate using fixed equations and a small fixed set of device sizes in order to discover the model overrides for the supported parameters. Such restrictions limit the effectiveness of the model override values. Furthermore, such studies are generally time-consuming and complicated. Therefore, there is a need in the art for a fast and efficient method of generating compact model parameter overrides (i.e., of producing customized compact model parameters that represent a semiconductor device at the chip, wafer or multi-wafer level in a manufacturing environment).

SUMMARY

In view of the foregoing, disclosed herein are embodiments of an automated, fast and efficient method of generating a customized compact model that represents a semiconductor device at the chip, wafer or multi-wafer level in a specific manufacturing environment.

An embodiment of the method comprises developing a general-purpose compact model for a device (i.e., a first model). This first model can be developed using model parameters that are generally representative of all of the multiple manufacturing environments for the device (i.e., representative of the overall manufacturing environment).

Additionally, measurement data can be collected from a specific manufacturing environment. The measurement data that is collected can comprise multiple different channel lengths (e.g., at least two different channel lengths) as well as various current and voltage measurements associated with those different channel lengths. For example, the current and voltage measurements associated with each different channel length can comprise saturation drain current (Idsat), linear drain current (Idlin), linear threshold voltage (Vtlin), saturation threshold voltage (Vtsat), high current (Ihigh), low current (Ilow), effective current (Ieff), leakage current (Ioff), etc.

After the measurement data are collected, they can be sorted by channel lengths. After sorting the data by channel lengths, at least one long channel length (e.g., the longest channel length measured) and one short channel length (e.g., the shortest channel length measured) can be identified and selected for further processing by the optimizer. One or more channel lengths in between the long and short channel lengths can also be identified and selected for further processing by the optimizer.

The optimizer receives the measurement data for the selected channel lengths and performs an automated multi-step optimization process based on this data in order to generate customized modeling parameters for the device.

Specifically, a first optimization process can be performed in order to generate a first set of modeling parameters for the device. This first set of modeling parameters is generated based on supplied starting values and first current and voltage measurements associated with a first channel length (e.g., based on the current and voltage measurements associated with the selected long channel length). Optionally, the user may establish ranges of values within which the supplied starting values must remain. Thus, the first set of modeling parameters can be based not on single current and voltage values, but rather ranges of current and voltage values.

Following the first optimization process, a second optimization process can be performed in order to generate a second set of modeling parameters. This second set of modeling parameters is generated based on starting values generated during the first optimization process (i.e., on the first set of modeling parameters corresponding to the first channel length) and on the current and voltage measurements associated with a second channel length that is shorter than the first channel length (e.g., based on the current and voltage measurements associated with the selected short channel length). As with the starting values used during the first optimization process, the user may optionally establish ranges of values within which the first set of modeling parameters must remain. Thus, the second set of modeling parameters can be based not on single current and voltage values, but rather ranges of current and voltage values.

Lastly, a final optimization process can be performed in order to generate the customized modeling parameters. These customized modeling parameters are generated based on a combination of both the first and second sets of modeling parameters, thereby, fine tuning the parameter values. To further tune the parameter values, measurement data from any other selected channel lengths can also be incorporated into this final optimization process.

Each phase of the multi-step optimization process can be automated and can be accomplished using any one of various optimization techniques. For example, optimization can be accomplished by applying genetic algorithms, by applying classic algorithms or by applying hybrid genetic algorithms.

Once the customized modeling parameters are generated by the optimizer they are translated, as necessary, and used to develop a second compact model. Thus, while the first model is general (i.e., based overall manufacturing environment), the second model is customized because it is representative of the specific manufacturing environment from which the measurement data was collected.

In order to determine and ensure the quality and accuracy of a customized model, the customized model (i.e., the second model) can be compared to both the first model and the measurement data collected.

These and other aspects of the embodiments of the invention will be better appreciated and understood when considered in conjunction with the following description and the accompanying drawings. It should be understood, however, that the following descriptions are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
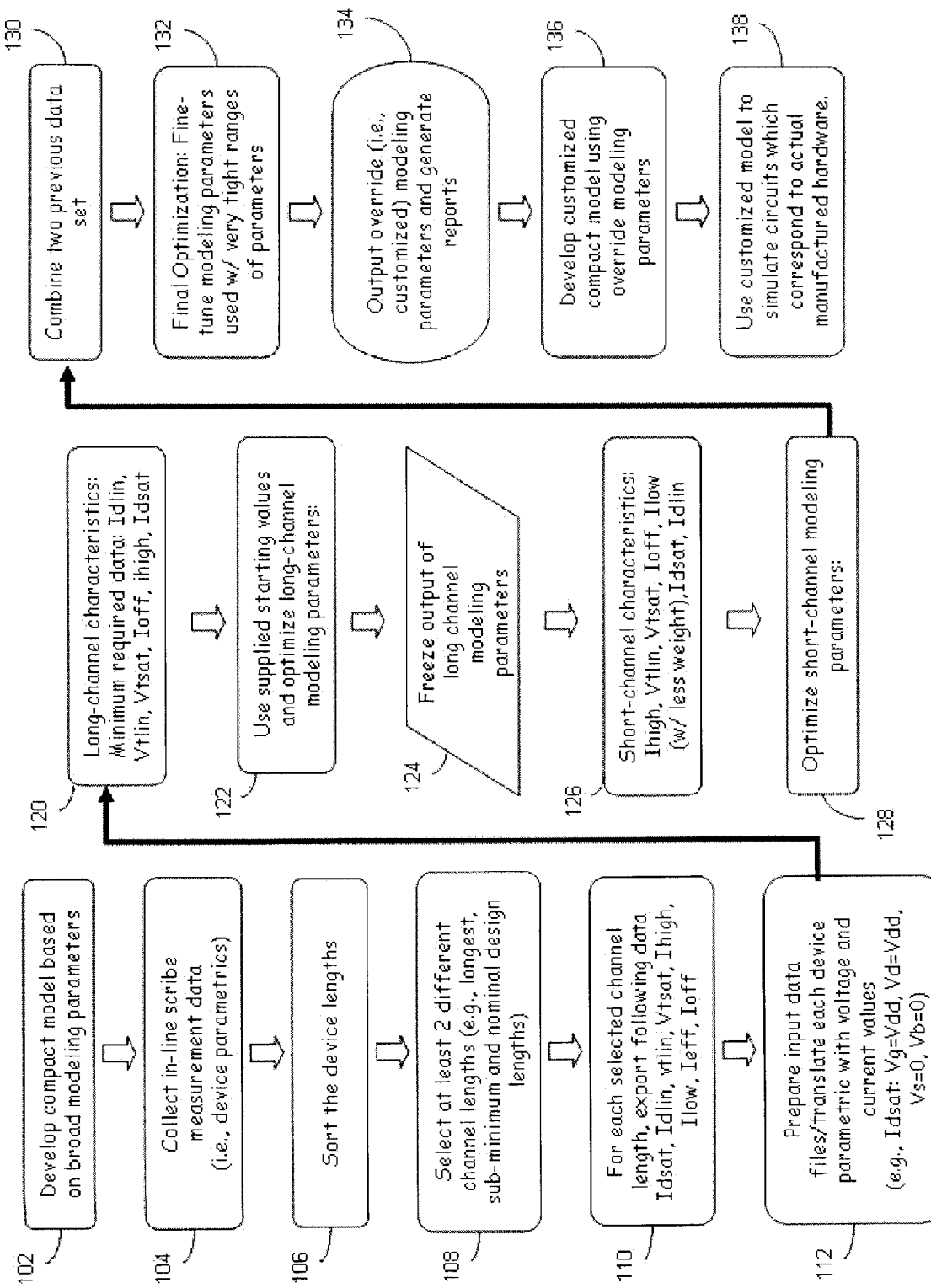
FIG. 1 is a flow diagram illustrating embodiments of the method of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, there is a need in the art for a fast and efficient method of generating compact model device parameter overrides (i.e., of producing customized compact model parameters that represent a semiconductor device, such as a field effect transistor, at the chip, wafer or multi-wafer level in a manufacturing environment).

In view of the foregoing, disclosed herein are embodiments of an automated, fast and efficient method of generating a customized compact model that represents a semiconductor device at the chip, wafer or multi-wafer level in a specific manufacturing environment. Specifically, measurement data is collected from a specific manufacturing environment and sorted by channel lengths. Then, an optimizer is used to generate customized modeling parameters based on the measurement data. The optimization processes is a multi-step process. First, a first set of modeling parameters is generated based on measurement data associated with a long channel length. Second, a second set of modeling parameters is generated based on the first set and on measurement data associated with a short channel length. Finally, the customized modeling parameters are generated based on both the first set and the second set. The customized modeling parameters are used to generate a customized compact device model representative of the specific manufacturing environment. Such a customized model allows for a more accurate circuit simulation.

More particularly, referring to FIG. 1, an embodiment of the method comprises developing a general-purpose compact model for a device (i.e., a first model) (102). The compact model can, for example, comprise any suitable type of compact model currently available in the industry (e.g., a Berkeley Short-Channel Insulated Gate Field Effect Transistor Model (BSIM), a Penn-State Phillips (PSP) model, HiSim, etc.). This first model can be developed using model parameters that are generally representative of all of the multiple manufacturing environments for the device (i.e., representative of the overall manufacturing environment).

Additionally, measurement data can be collected from a specific manufacturing environment (104). More specifically, in a specific manufacturing environment (e.g., in a given line, factory, time, etc.) electrical test measurements can be taken from structures (e.g., field effect transistors) located in the scribe lines of a production wafer (i.e., in-line scribe measurements are taken). The measurement data that is collected can comprise, for example, geometric parameters (e.g., effective transistor channel lengths (Leff or Lpoly), gate oxide thicknesses (Tox), etc.), DC parameters (e.g., various current and voltage measurements), and AC parameters (e.g., overlap capacitance (Cov), source/drain junction capacitance (Cj), junction capacitance under the gate electrode (Cjswg), etc.). Specifically, the measurement data can comprise the effective transistor channel lengths (Leff) of transistors with different channel lengths (e.g., at least two different channel lengths). There is no maximum limit to the number of different Leffs collected. Various DC parameters (i.e., current and voltage measurements) that are associated with different devices having these different channel lengths can also be collected. For example, the current and voltage measurements associated with each different channel length can comprise saturation source/drain current (Idsat), linear source/drain current (Idlin), linear threshold voltage (Vtlin), saturation threshold voltage (Vtsat), high current (Ihigh), low current (Ilow), effective current (Ieff), leakage current (Ioff), drive current (Ion), etc.

After the measurement data is collected, it can be sorted by the different channel lengths (106). After sorting the data by channel lengths, at least one long channel length (e.g., the longest channel length measured) and one short channel length (e.g., the shortest channel length measured) can be identified, selected and exported for further processing (108-110). One or more nominal channel lengths in between the long and short channel lengths can also be identified, selected, and exported for further processing.

Based on the collected data, input data files are prepared. These input files indicating the device type, the designed channel length and width, the operating voltage (Vdd) as well as any other measurement data collected that is associated with a given channel length (112).

The optimizer receives these input data files and performs an automated multi-step optimization process based on the measurement data that is collected at process 104 in order to generate customized modeling parameters for the device.

Specifically, a first optimization process can be performed in order to generate a first set of modeling parameters (i.e., long device specific modeling parameters) for use in a given type of compact model (e.g., BSIM, PSP, HiSim, etc.) of that device (120-124). This first set of modeling parameters is generated based on both supplied starting values and first current and voltage measurements that are associated with a first channel length (e.g., based on the current and voltage measurements associated with the long channel length selected at process 108). The supplied starting values can comprise a released set of parameter values that solve typical technology values. Optionally, the optimizer can be supplied with ranges of values within which the starting values must remain and these ranges can be specified as a percentage/or offset of the starting parameter value. Thus, the first set of modeling parameters can be based not on single current and voltage values, but rather ranges of current and voltage values.

During this first optimization process, for example, if the compact model for the device is a BSIM, then the suggested modeling parameters solved for can be Vth0, u0, nfactor, and pdiblc2. The optimizer solves for these parameters so that all of the BSIM modeling parameters can be available for optimization. For PSP, HiSIM, and other models, the suggested modeling parameters will have different names but will still be applied to the long devices.

Once generated, the first set of modeling parameters are frozen and remain frozen during optimization of shorter (remaining) channel devices at process 126-128, discussed below (124).

Following the first optimization process of the long channel device, a second optimization process can be performed in order to generate a second set of modeling parameters (126-128). This second set of modeling parameters is generated based on both the first set of modeling parameters corresponding to the first channel length and the current and voltage measurements associated with a second channel length that is less than the first channel length (e.g., based on the current and voltage measurements associated with the selected short channel length). Thus, the starting values for this second optimization process are the modeling parameters obtained during the first optimization process (i.e., the first set of modeling parameters). Again, optionally, the user may establish ranges of values within which the parameter values from the first set must remain and these ranges can be specified as a percentage/or offset of the starting parameter value. Thus, the second set of modeling parameters can be based not on single current and voltage values, but rather ranges of current and voltage values.

During this second optimization process, for example, if the compact model for the device is a BSIM, then the suggested modeling parameters solved for can be dvt0, dvt1, eta0, dsub, vsat, rdsw, lu0, cdsc, and pdiblc1. However, in principle, any parameter related to short-channel devices can be optimized. Again, for PSP, HiSIM, and other models, the suggested modeling parameters will have different names but will still be applied to only the short devices.

Lastly, a third and final optimization process can be performed in order to finely tune the parameter values and, thereby, generate the customized modeling parameters (i.e., model overrides associated with the specific manufacturing environment (130-132). These customized modeling parameters are generated based on a combination of both the first and second sets of modeling parameters. That is, the starting values for this final optimization process are the values calculated from both the long and short device. A key point in this final optimization process is that the range of the parameters are tightened (i.e., finely tuned) to a smaller percentage of the starting values so that the final tuning does not disturb short-channel and long-channel device fit obtained from previous steps. To further tune the parameter values, measurement data from any other selected channel lengths can also be incorporated into this third optimization process.

During this final optimization process, for example, if the compact model for the device is a BSIM and if each of the devices associated with different measured channel lengths (i.e., devices with long, short and nominal channel lengths) are optimized together, then the suggested parameters solved for can be: dvt0, dvt1, eta0, dsub, vsat, rdsw, lu0, cdsc, and optionally pdiblc1, vth0, u0, and pdiblc2. Again, for PSP, HiSIM, and other models, the suggested modeling parameters will have different names but will still be applied.

Each phase of the multi-step optimization process can be automated and can be accomplished using any one of various known optimization techniques. For example, optimization can be accomplished by applying genetic algorithms (i.e., by using a genetic algorithm optimizer), by applying classic algorithms (i.e., by using a classic algorithm optimizer) or by applying hybrid genetic algorithms (i.e., by using a hybrid genetic algorithm optimizer). For example, the automatic BSIM3/4 model parameter extraction with penalty functions technique that is based on genetic algorithms (See U.S. Pat. No. 6,314,390 issued to Bittner et al. on Nov. 6, 2001 and incorporated herein by reference) can be used.

Since this multi-step optimization process is based on a specific manufacturing environment, the customized modeling parameters (i.e., parameter overrides) can be generated for each chip, each wafer, each split or each lot. Once generated the customized modeling parameters (i.e., model overrides) can be output and reports can be generated related to these overrides (134). For example, such reports can include a summary of the results as well as a comparison of the customized modeling parameters to the broad modeling parameters used to develop the general-purpose compact model at process (102).

Furthermore, once the customized modeling parameters are generated by the optimizer, they can be translated, as necessary, and used to develop a second compact model (136). Thus, while the first model is general (i.e., based overall manufacturing environment), the second model is customized because it is representative of the specific manufacturing environment from which the measurement data was collected. The customized model can, be used in simulations of circuits which contain the device (138) and these simulations will, therefore, correspond to the actual manufactured hardware (138).

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 2:
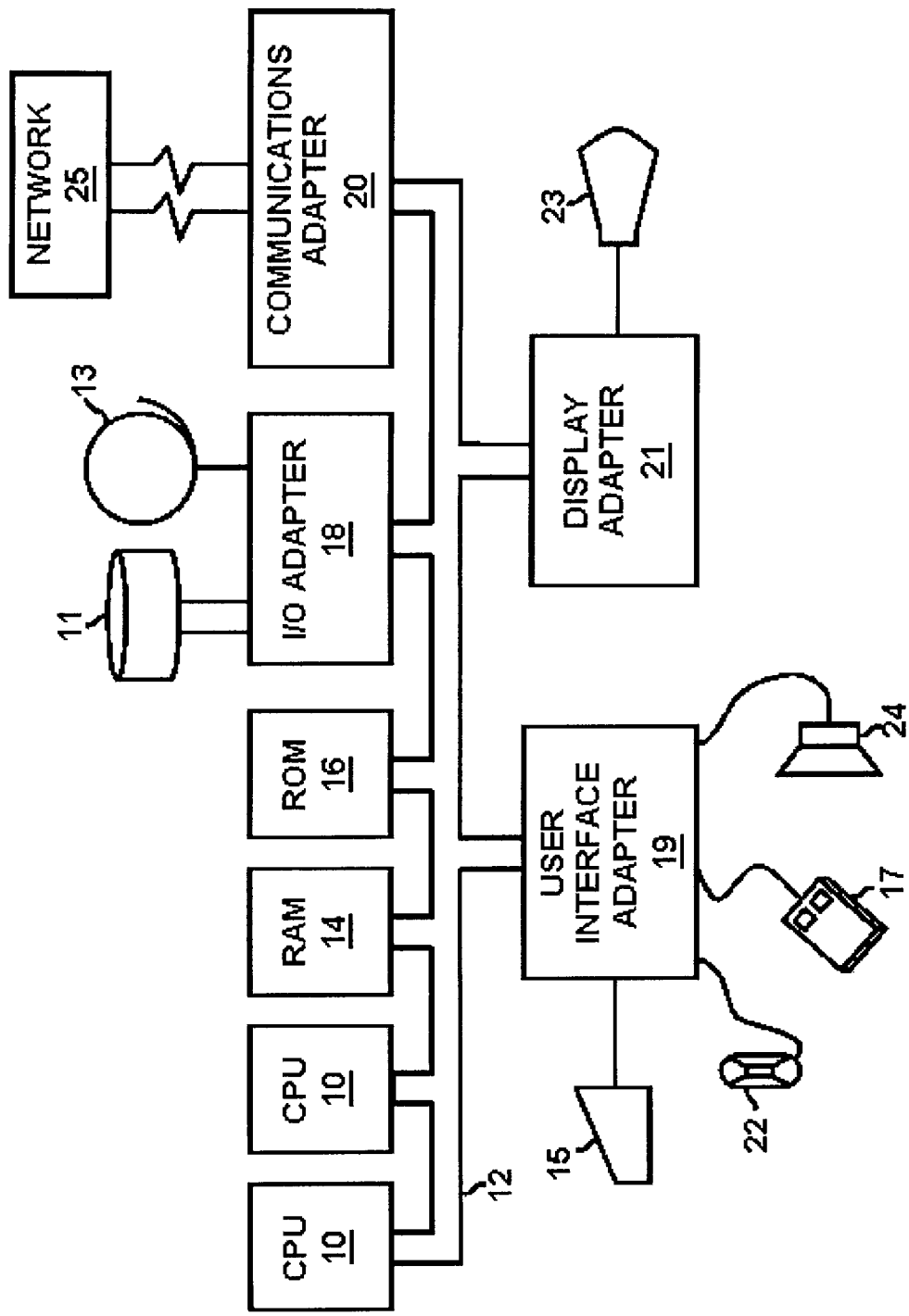
FIG. 2 is a schematic diagram of an exemplary hardware structure that may be used to implement the method of the invention.

A representative hardware environment for practicing the embodiments of the invention is depicted in FIG. 2. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Therefore, disclosed above, are embodiments of an automated, fast and efficient method of generating a customized compact model that represents a semiconductor device at the chip, wafer or multi-wafer level in a specific manufacturing environment. Specifically, measurement data is collected from a specific manufacturing environment and sorted by channel lengths. Then, an optimizer is used to generate customized modeling parameters based on the measurement data. The optimization processes is a multi-step process. First, a first set of modeling parameters is generated based on measurement data associated with a long channel length. Second, a second set of modeling parameters is generated based on the first set and on measurement data associated with a short channel length. Finally, the customized modeling parameters are generated based on both the first set and the second set. The customized modeling parameters are used to generate a customized compact device model representative of the specific manufacturing environment.

The methodology disclosed is beneficial because it is not dependent on specific types of compact models, it does not limit the number of parameters that can be optimized and it is capable of optimizing the models for various channel lengths using a minimum of required device data. Furthermore, such automatic generation of overrides can reduce workload of modelers and can be used by circuit designers to evaluate and debug the functionality of their circuits, based on actual hardware manufacturing environments, even when the technology is not mature. This methodology can be also used for generation of overrides for different structures. For example, this can be used for evaluation of systematic macro-macro offset.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A method of generating a model, said method comprising:

receiving, by a processor, measurement data collected from devices in scribe-lines of a production wafer manufactured in a specific manufacturing environment selected from amongst multiple manufacturing environments, said devices comprising field effect transistors, said specific manufacturing environment comprising at least a specific factory, and said measurement data comprising, for each device, an effective channel length measurement and current and voltage measurements;

sorting, by said processor, said measurement data so as to identify and select at least the following:
a first channel length which is a longest channel length measured, said first channel length being associated with first current and voltage measurements; and
a second channel length which is a shortest channel length measured, said second channel length being associated with second current and voltage measurements;

performing, by said processor, an optimization process based on said measurement data in order to generate customized modeling parameters for a field effect transistor, said customized modeling parameters associated with said specific manufacturing environment and said performing of said optimization process comprising performing a multi-step optimization process comprising:
performing a first optimization process in order to generate a first set of modeling parameters for said field effect transistor, said first set being based on supplied starting values and said first current and voltage measurements associated with said first channel length;
performing a second optimization process in order to generate a second set of modeling parameters for said field effect transistor, said second set being based on said first set and on said second current and voltage measurements associated with said second channel length;
combining said first set and said second set to form a combined set; and
performing a third optimization process in order to generate said customized modeling parameters for said field effect transistor, said customized modeling parameters being based on said combined set; and developing, by said processor, a model for said field effect transistor based on said customized modeling parameters, said model being representative of said specific manufacturing environment.

2. The method of claim 1, said first current and voltage measurements and said second current and voltage measurements each comprising at least one of saturation drain current, linear drain current, linear threshold voltage, saturation threshold voltage, high current, low current, effective current and leakage current.

3. The method of claim 1, said optimization process being automated and comprising applying an optimization algorithm and said applying of said optimization algorithm comprising applying one of a classic algorithm, a genetic algorithm, and a hybrid genetic algorithm.

4. The method of claim 1, said specific manufacturing environment further comprising at least one of a given line in said specific factory and a given time period.

5. The method of claim 1, said first set being further based on first ranges within which said starting values must remain and said second set being further based on second ranges within which said first set must remain.

6. A method of generating a model, said method comprising:
   developing a first model for a field effect transistor, said first model being representative of all of multiple manufacturing environments for said field effect transistor;
   receiving, by a processor, measurement data collected from devices in scribe-lines of a production wafer manufactured in a specific manufacturing environment selected from amongst said multiple manufacturing environments, said devices comprising field effect transistors, said specific manufacturing environment comprising at least a specific factory, and said measurement data comprising, for each device, an effective channel length measurement and current and voltage measurements;
   sorting, by said processor, said measurement data so as to identify and select at least the following:
      a first channel length which is a longest channel length measured, said first channel length being associated with first current and voltage measurements; and
      a second channel length which is a shortest channel length measured, said second channel length being associated with second current and voltage measurements;
   performing, by said processor, an optimization process based on said measurement data and said first model in order to generate customized modeling parameters for a field effect transistor, said customized modeling parameters associated with said specific manufacturing environment and said performing of said optimization process comprising performing a multi-step optimization process comprising:
      performing a first optimization process in order to generate a first set of modeling parameters for said field effect transistor, said first set being based on supplied starting values and said first current and voltage measurements associated with said first channel length;
      performing a second optimization process in order to generate a second set of modeling parameters for said field effect transistor, said second set being based on said first set and on said second current and voltage measurements associated with said second channel length;
      combining said first set and said second set to form a combined set; and
      performing a third optimization process in order to generate said customized modeling parameters for said field effect transistor, said customized modeling parameters being based on both said combined set;
   developing, by said processor, a second model based on said customized modeling parameters for said field effect transistor, said second model being representative of said specific manufacturing environment; and
   using said second model in simulations of circuits containing said field effect transistor.

7. The method of claim 6, said first current and voltage measurements and said second current and voltage measurements each comprising at least one of saturation drain current, linear drain current, linear threshold voltage, saturation threshold voltage, high current, low current, effective current and leakage current.

8. The method of claim 6, said optimization process being automated and comprising applying an optimization algorithm and said applying of said optimization algorithm comprising applying one of a classic algorithm, a genetic algorithm, and a hybrid genetic algorithm.

9. The method of claim 6, said specific manufacturing environment further comprising at least one of a given line in said specific factory and a given time period.

10. The method of claim 6, said first set being further based on first ranges within which said starting values must remain and said second set being further based on second ranges within which said first set must remain.

11. A program storage device readable by computer and tangibly embodying a program of instructions executable by said computer to perform a method of generating a model, said method comprising:
   receiving measurement data collected from devices in scribe-lines of a production wafer manufactured in a specific manufacturing environment selected from amongst multiple manufacturing environments, said devices comprising field effect transistors, said specific manufacturing environment comprising at least a specific factory, and said measurement data comprising, for each device, an effective channel length measurement and current and voltage measurements;
   sorting said measurement data so as to identify and select at least the following:
      a first channel length which is a longest channel length measured, said first channel length being associated with first current and voltage measurements; and
      a second channel length which is a shortest channel length measured, said second channel length being associated with second current and voltage measurements;
   performing an optimization process based on said measurement data in order to generate customized modeling parameters a field effect transistor, said customized modeling parameters associated with said specific manufacturing environment and said performing of said optimization process comprising performing a multi-step optimization process comprising:
      performing a first optimization process in order to generate a first set of modeling parameters for said field effect transistor, said first set being based on supplied starting values and said first current and voltage measurements associated with said first channel length;
      performing a second optimization process in order to generate a second set of modeling parameters for said field effect transistor, said second set being based on said first set and on said second current and voltage measurements associated with said second channel length;
      combining said first set and said second set to form a combined set; and performing a third optimization process in order to generate said customized modeling parameters for said field effect transistor, said customized modeling parameters being based on both said combined set; and developing a model for said field effect transistor based on said customized modeling parameters, said model being representative of said specific manufacturing environment.

12. The program storage device of claim 11, said first current and voltage measurements and said second current and voltage measurements each comprising at least one of saturation drain current, linear drain current, linear threshold voltage, saturation threshold voltage, high current, low current, effective current and leakage current.

13. The program storage device of claim 11, said optimization process being automated and comprising applying an optimization algorithm and said applying of said optimization algorithm comprising applying one of a classic algorithm, a genetic algorithm, and a hybrid genetic algorithm.

14. The program storage device of claim 11, said specific manufacturing environment further comprising at least one of a given line in said specific factory and a given time period said applying of said optimization algorithm comprising applying one of a classic algorithm, a genetic algorithm, and a hybrid genetic algorithm.

15. The program storage device of claim 11, said first set being further based on first ranges within which said starting values must remain and said second set being further based on second ranges within which said first set must remain.

* * * * *